United States Patent [19]

Comley

[11] 4,198,608
[45] Apr. 15, 1980

[54] GLITCH DETECTOR AND TRAP

[75] Inventor: William Comley, Rancho Palos Verdes, Calif.

[73] Assignee: McDonnell Douglas Corporation, Long Beach, Calif.

[21] Appl. No.: 921,961

[22] Filed: Jul. 5, 1978

[51] Int. Cl.² .................... H03K 13/32; H03K 13/02; H03K 5/18
[52] U.S. Cl. .................................. 328/162; 328/151; 340/347 CC; 340/347 DA
[58] Field of Search .................. 328/162, 163, 151; 340/347 DA, 347 CC

[56] References Cited

U.S. PATENT DOCUMENTS

| | | | |
|---|---|---|---|
| 3,665,327 | 5/1972 | Prentky et al. | 328/163 |
| 3,800,236 | 3/1974 | Riethmuller et al. | 328/162 |
| 3,877,023 | 4/1975 | Spicer et al. | 340/347 DA |
| 4,016,559 | 4/1977 | Pastoriza | 340/347 CC |
| 4,132,908 | 1/1979 | Hughes | 328/151 X |

OTHER PUBLICATIONS

A Users Handbook of D/A & A/D Converters by Hnatek Copyright 1976, John Wiley & Sons Inc. "Sources of Error in D/A Conversion" pp. 238–242.

*Primary Examiner*—John S. Heyman
*Attorney, Agent, or Firm*—Henry M. Bissell

[57] ABSTRACT

A glitch detector and trap circuit is disclosed for removing a glitch generated by a digital-to-analog (D/A) converter due to an error in one or more bits of the input digital signal. The analog output signal is delayed by one sample period. The converter output signal is then subtracted from the delayed converter output signal. This difference signal is passed through a full-wave precision rectifier. Thereafter, the notified signal is clipped at a predetermined trigger level so that a glitch will cause an output pulse. The output pulse caused by a glitch is used to operate a monostable circuit. The monostable circuit in turn, is utilized to change a track and store amplifier from its track mode to the store mode. In this manner, the track and store amplifier will not pass the glitch, but will remain at its previous setting. A rise-time delay circuit is interposed ahead of the track and store amplifier so that it will not respond instantaneously to the next sample pulse before its store mode is initiated.

12 Claims, 3 Drawing Figures

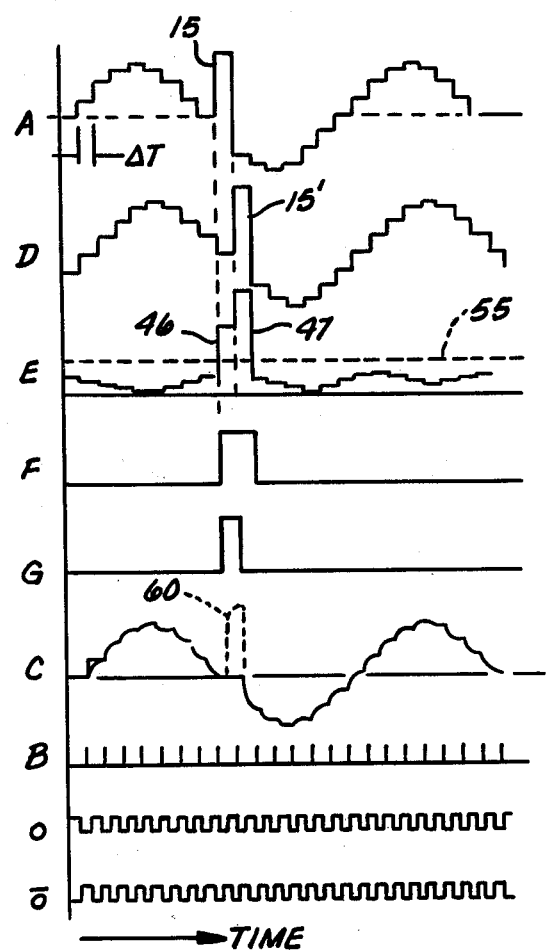
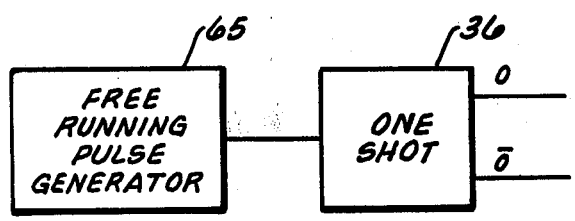

GLITCH DETECTOR AND TRAP

BACKGROUND OF THE INVENTION

1. Field of the Invention

This invention relates generally to the control of a machine by a digital signal generated by a computer and converted to an analog signal, and more particularly relates to a glitch detector and trap.

2. Description of the Prior Art

Digital computers are frequently used to activate, operate or drive various analog systems. Hence, an analog signal may be derived from the digital signal which, in turn, is used to operate a machine. Among such analog systems are computer controlled machine tools or flight simulation systems where a base platform is moved to simulate a flight.

In such analog systems, a digital computer is interfaced to a mechanical servo-control device or machine by means of a digital-to-analog (D/A) converter. The output of the converter is generally a time variant function which commands the servo system. However, the digital-to-analog converted output is not a smooth and continuous function. Rather it consists of discrete steps corresponding to the sample periods of the converter. The steps are generally small in magnitude and short in duration such, for example, as 20 milliseconds. Obviously, the duration of each step is small compared to the frequencies or passband of the machine or function to be controlled.

In such systems, a serious problem may arise. This may, for example, be due to the fact that some sample or step of the analog signal is erroneous because a significant data bit is either lost or miscalculated. This will result in a large amplitude spurious spike of the analog signal which is usually called a glitch and appears at the output of the converter. It will be realized that such spikes are highly undesirable and may cause unwanted, large physical motions which may be highly disagreeable to a trainee on a flight simulation system.

In this connection, reference is made to a patent to Salmet U.S. Pat. No. 3,375,445. The patent discloses a system to be used in a pulse position modulation system. According to the system, the through-put is normally gated off and operates only when a single pulse is received. However, the system is prevented from operating when multiple pulses are received. To this end, two channels are connected to the output of an amplifier. One channel includes a delay line; the second channel operates to cut off a gate if more than one pulse is received in a certain period of time.

Furthermore, the patent to Prentky et al. U.S. Pat. No. 3,665,327 discloses an inhibiting gate to exclude extraneous signals. The noise discriminator described is all digital in nature and does not generate an analog signal.

SUMMARY OF THE INVENTION

In accordance with the present invention, there is provided a circuit for substantially removing the undesirable effects of a glitch. Such a glitch may be caused by an error in at least one bit of a digital signal applied to a digital-to-analog converter. The thus generated analog signal, in turn, is utilized for controlling a machine.

The circuit comprises a source of digital signals which may include an error in at least one bit. There is further provided an analog-to-digital converter coupled to the digital source for impressing on the converter the digital signals. The converter, in turn, generates output steps, each having a duration of one sample period. A track and store amplifier is coupled to the converter. The track and store amplifier includes a switch which when actuated will convert the track mode of the amplifier into the store mode. Means are coupled to the converter for delaying the converter output signal by one sample period. The output of the converter is subtracted from the output of the means for delaying the converter output signal. This means is coupled to the converter and to the means for delaying. A full-wave rectifier is coupled to the output of the means for subtracting. The signal developed by the full-wave rectifier is clipped, and the means for clipping has a predetermined trigger level. Hence, the means for clipping will generate an output pulse in response to a glitch.

Thus, the output of the means for subtracting and the full-wave rectifier provide the absolute value of the difference between the input signal and delayed input signal. Finally, means are coupled to the means for clipping for operating the switch of the track and store amplifier by its output pulse. This in turn causes the track and store amplifier to revert into its store mode. Hence, the circuit will substantially eliminate the effects of a glitch.

Such a track and store amplifier, sometimes called a track and hold amplifier, has been disclosed in a book by Hnatek, entitled *A User's Handbook of D/A and A/D Converters,* published by John Wiley & Sons, New York, 1976. Pages 238–242 of this book relate to sources of error in digital-to-analog conversion. FIG. 4–158(c) on page 239 discloses such a track and hold amplifier. The glitch dealt with in this book relates to the glitch or transient generated by the switching of the digital-to-analog converter itself. The converter output is delayed and is used to operate the switch of the track and hold amplifier. Hence, a "blanking window" is incorporated around the glitch to obtain an improvement in the glitch height, step ring or overshoot. It is also pointed out on page 241 that such track and hold amplifiers have their own transient problems illustrated in FIG. 4–158(d).

The novel features that are considered characteristic of this invention are set forth with particularity in the appended claims. The invention itself, however, both as to its organization and method of operation, as well as additional objects and advantages thereof, will best be understood from the following description when read in connection with the accompanying drawings.

BRIEF DESCRIPTION OF THE DRAWINGS

FIG. 2 is a chart illustrating various wave shapes generated at various points of the circuit of FIG. 1, each wave shape being identified by a capital letter shown in FIG. 1; and FIG. 3 is a block diagram to illustrate a modification of a portion of the circuit of FIG. 1.

DESCRIPTION OF THE PREFERRED EMBODIMENT

Figure 1:
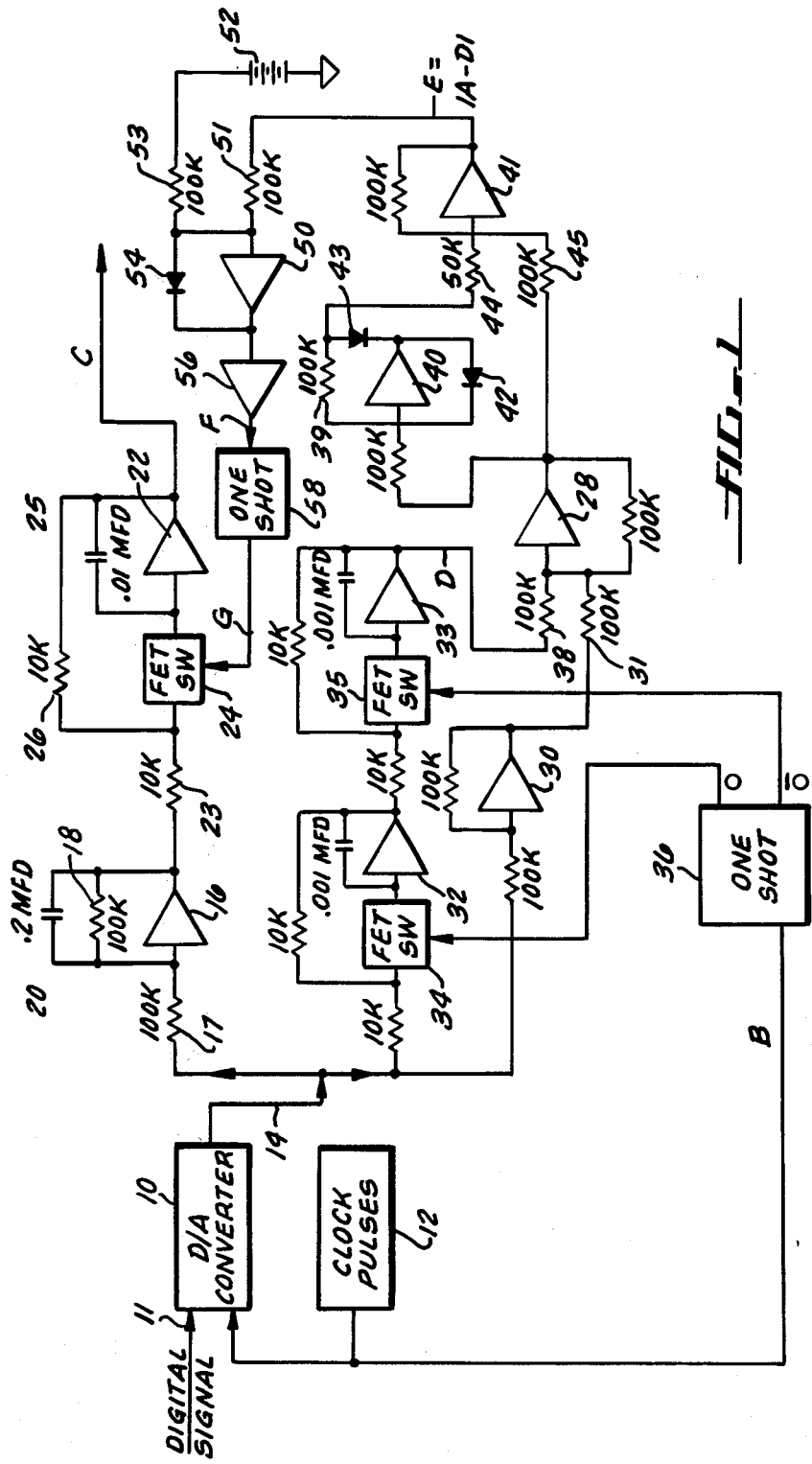
FIG. 1 is a circuit diagram in block form of the glitch detector and trap embodying the present invention.

Referring now to FIGS. 1 and 2, there is illustrated a circuit diagram and some wave shapes occurring at various places of the circuit diagram of a preferred embodiment of the present invention. There is provided a digital-to-analog (D/A) converter 10 which receives digital signals as indicated by arrow 11. These digital signals may, for example, be derived from a digital computer. In addition, clock pulses as shown by block 12, are applied to the converter 10. The clock pulses constitute sample pulses to cause the converter 10 to periodically sample the digital input signals once for each sampling period of the D/A converter.

The output signals of the converter 10 are obtained from output lead 14 and are designated A in FIG. 2. It will be understood that the glitch shown at 15 by the wave form A in FIG. 2, may be somewhat exaggerated. A relatively gross sampling rate has been illustrated in FIG. 2 for purposes of illustration.

The converter output signal A is now impressed on an amplifier 16 through an input resistor 17. The amplifier 16 has a feedback consisting of a parallel combination of a resistor 18 and a small capacitor 20. The purpose of the amplifier 16 and its feedback is to delay the rise time of the pulses, shown at A in FIG. 2. The purpose of this delay in the rise time will be explained hereinafter.

The output of the amplifier 16 is now impressed on an amplifier 22, which represents the track and hold or track and store amplifier, as described in the publication previously referred to. The amplifier 22 has an input resistor 23 followed by a switch 24. The switch 24, as indicated, is preferably a field effect transistor, which is normally closed. The amplifier feedback is provided by a capacitor 25 connected directly between the input and the output of the amplifier 22. There is also provided a feedback resistor 26 which is connected between the output of amplifier 22 and the junction point between input resistor 23 and switch 24.

As long as the switch 24 is closed, the output signal of the rise time delay amplifier 16 is applied by resistor 23 and switch 24 to the input of the track and hold amplifier 22. However, when the switch 24 is operated to become open, the input signal is no longer applied to the input of amplifier 22, but only the output signal through the capacitor 25. This then constitutes the store mode of the amplifier because the amplifier retains its previous setting.

How the switch 24 is operated will now be described. The signal A from the converter 10 is now applied to an adder amplifier 28 which is capable of adding two input signals. One of the signals is the waveform A, which is inverted by the amplifier 30 operating as a signal inverter. Its inverted output signal is impressed on the amplifier 28 through an input resistor 31. At the same time, the waveform A, that is the converter 10 output, is delayed by $\Delta T$, which is one sample period as shown in FIG. 2 under wave sample A. The sample period may be typically 10 milliseconds. This delay is accomplished by the two amplifiers 32 and 33, each of which constitutes a track and store amplifier, as shown and explained in connection with the track and store amplifier 22. Each of the track and store amplifiers 32, 33 has a switch 34 and 35. These switches, which may be field effect transistors, are alternately opened and closed to put the respective amplifiers 32 and 33 into the store mode, as previously explained.

The two switches 34 and 35 are operated by a one-shot multivibrator 36. This is a monostable circuit which, upon being triggered, generates an output pulse of predetermined duration, and then reverts into its stable state. The multivibrator 36 may be triggered by the clock pulses 12, illustrated as a waveform B in FIG. 2. These clock pulses initiate each sample period of the converter 10. They also trigger the multivibrator 36 to generate the output signals o and $\bar{o}$. The two signals o and $\bar{o}$, as shown in FIG. 2 are complements of each other, and each has a time duration of one-half $\Delta T$.

Hence, during each sample period $\Delta T$, first the track and store amplifier 32 is held for one-half sample period and subsequently, the other track and store amplifier 35 is held for the other half of the period. The result of this is that the output signal D of amplifiers 32 and 33 exactly reproduces the original signal A, as shown in FIG. 2 with a time delay of $\Delta T$. The output signal D also shows the glitch 15'.

Now this delayed signal D is impressed by coupling resistor 38 upon summing amplifier 28 along with the inverted input signal A to generate an output signal which is the difference between the waveforms A and D of FIG. 2.

This difference signal is now impressed upon a precision, full-wave rectifier circuit including amplifiers 40 and 41. It will be noted that the amplifier 40 has a feedback circuit including a rectifier 42 which is poled to permit current to pass from the output to the input of the amplifier. Another rectifier 43 is poled in the opposite direction, connected in series with a resistor 39 and only permits current flow from the input to the output of the amplifier. The signal from amplifier 40 is now impressed by input resistor 44 upon the amplifier 41, as is the output signal of summing amplifier 28, which is effected by resistor 45. The result is a wave form E, as shown in FIG. 2. This constitutes the absolute value of the difference between wave forms A and D, or E=1A-D1, as indicated in FIG. 1.

The wave form E now has two relatively large spikes 46 and 47. The height of the spike or glitch 46 is somewhat reduced by the subtraction operation, while the spike 47 has the same amplitude as the glitch 15 of wave form A.

This wave form E is now passed through a clipper amplifier 50. The wave form E is impressed through input resistor 51. At the same time, a negative bias is applied by battery 52 and resistor 53 to the input of amplifier 50. A rectifier 54 connects input and output of the amplifier to permit current flow between input and output. The trigger level is shown in FIG. 2 at wave form E by the dotted line 55. Hence, only a glitch, such as 46, 47 having an amplitude larger than the trigger level 55 is passed by the clipper 50. The output of clipper amplifier 50 is a pulse as shown by the wave form F, which has been inverted by the inverter 56. Thus, a normal signal below the trigger level 55 is eliminated and what remains are the spikes 46, 47, as shown by wave form F in FIG. 2. This trigger output is now applied to another one-shot multivibrator 58 which has a pulse width corresponding to $\Delta T$. This pulse is shown as wave form G in FIG. 2. It will hence open the switch 24 in response to a trigger pulse, as shown by wave form F for the length of one sample period. This in turn will hold the track and store amplifier 22 at its previous value.

The output of the track and store amplifier 22 is shown by wave form C in FIG. 2. It shows in dotted line the glitch 60 which has been eliminated from the output of the track and store amplifier.

The purpose of the rise-time delay provided by amplifier 16 is to ensure that the track and store amplifier 24 does not respond instantaneously to a succeeding sample pulse which may be a glitch before it can be converted from the track to the store mode.

It should be noted that all amplifiers of FIG. 1, such as amplifiers 16, 22, 32, 33, 40, 50 and 56 are operational amplifiers. The respective circuit constants of the resistors and capacitors are also shown in FIG. 1.

It should be noted that the circuit of FIG. 1 is the preferred embodiment of the present invention because the one-shot multivibrator 36 is controlled by the clock pulse B. There is a definite time relationship between the time delay provided by amplifiers 32 and 33 and the operation of the converter 10. However, it is also feasible to control the one-shot multivibrator 36 by a free running pulse generator 65 as shown in FIG. 3. In this case, there is no precise time relationship between the operation of the converter 10 and the multivibrator 36 and its output pulses o and ō. It will, of course, be understood that the period of the free running pulse generator 65 should be as close as possible to the clock pulses B of FIG. 2.

It will be realized that the glitches discussed herein may also be eliminated by conventional filtering techniques. In this case, however, the passband of the control process may result in unwanted restrictions, and may impose unacceptable time delays on the output signal, such as shown at C in FIG. 2.

The circuit of the present invention may not only be used to protect computer operated machine tools, but may also be applied to servo-control aircraft control surfaces. In general, it may be utilized to control servo-controlled actuators to protect structural test specimens.

There has thus been disclosed a circuit which operates as a glitch detector and trap. It is relatively simple in construction and will protect machinery controlled by an analog-to-digital converter from the undesirable effects of glitches. Such glitches may be due to miscalculations of the computer or bit errors of the digital signal applied to a digital-to-analog converter.

I claim:

1. A circuit for substantially removing the undesirable effects of a glitch caused by an error in at least one bit of a digital signal applied to a digital-to-analog converter, the analog signal in turn being utilized for controlling a machine, said circuit comprising:
   a source of digital signals which may include an error in at least one bit;
   an analog-to-digital converter coupled to said source for impressing on said converter digital signals, said converter generating output pulses, each having a duration of one sample period;
   a track and store amplifier coupled to said converter, said track and store amplifier including a switch, which when actuated will convert the track mode of said amplifier into the store mode;
   means coupled to said converter for delaying the converter output signal by one sample period;
   means for subtracting the output of said converter from the output of said means for delaying the converter output signal and coupled to said converter and to said means for delaying;
   a full-wave rectifier coupled to the output of said means for subtracting;
   means for clipping the signal developed by said full-wave rectifier and coupled thereto, said means for clipping having a predetermined trigger level to derive an output in response to a glitch; and
   means coupled to said means for clipping for operating said switch in response to the output of said means for clipping, thereby to cause said track and store amplifier to revert into the store mode to thereby substantially eliminate the effects of a glitch.

2. A circuit as defined in claim 1 wherein means for delaying the rise time of the signal from said converter is provided, said means for delaying the rise time being coupled between said converter and said track and store amplifier.

3. A circuit as defined in claim 1 wherein said means for delaying the converter output signal includes two additional track and hold amplifiers, each having a switch, and a monostable circuit having complementary outputs for operating respective ones of the switches of said two additional track and hold amplifiers.

4. A circuit as defined in claim 1 wherein said switch of said track and hold amplifier consists of a field effect transistor.

5. A circuit as defined in claim 3 wherein the two switches of said two additional track and hold amplifiers consist each of a field effect transistor.

6. A circuit as defined in claim 1 wherein said means for subtracting the converter output signal and said delayed converter output signal includes an inverter amplifier and an adder for adding the inverted converter output signal to the delayed converter output signal.

7. A circuit as defined in claim 1 wherein said means for clipping is followed by an inverter for energizing a monostable circuit, which in turn, operates the switch of said track and hold amplifier.

8. A circuit as defined in claim 3 wherein a free running oscillator is provided for controlling said monostable circuit.

9. A circuit as defined in claim 3 wherein said converter generates sample pulses, and means for impressing said sample pulses on said monostable circuit.

10. The method for substantially removing the undesirable effects of a glitch caused by an error in at least one bit of a digital signal, said method comprising the steps of:
    converting the digital signal to an analog signal consisting of output pulses, each having a duration of one sample period;
    passing the output pulses to a utilization point in the absence of a glitch;
    delaying the output pulses by one sample period;
    subtracting the delayed output pulses from the output pulses;
    full-wave rectifying the subtracted pulses;
    clipping the full-wave rectified pulses to derive an output pulse above a predetermined trigger level in response to a glitch; and
    holding the output pulses for the duration of one sample period in response to an output pulse obtained from the clipping, thereby to substantially eliminate the effects of a glitch.

11. The method defined in claim 10 wherein the rise time of the converted output pulses is delayed by a small portion of a sample period.

12. The method defined in claim 10 wherein one of the converted output signal and the delayed converted output signal is inverted and subsequently added to the other signal.

* * * * *